(12) United States Patent
Buckley et al.

(10) Patent No.: US 12,527,057 B2
(45) Date of Patent: Jan. 13, 2026

(54) MICRO-ELECTRONIC DEVICE WITH INSULATED SUBSTRATE, AND ASSOCIATED MANUFACTURING METHOD

(71) Applicant: COMMISSARIAT A L'ENERGIE ATOMIQUE ET AUX ENERGIES ALTERNATIVES, Paris (FR)

(72) Inventors: Julien Buckley, Grenoble (FR); René Escoffier, Grenoble (FR); Charlotte Gillot, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 488 days.

(21) Appl. No.: 18/011,030

(22) PCT Filed: Jun. 15, 2021

(86) PCT No.: PCT/EP2021/066138
§ 371 (c)(1),
(2) Date: Dec. 16, 2022

(87) PCT Pub. No.: WO2021/255039
PCT Pub. Date: Dec. 23, 2021

(65) Prior Publication Data
US 2023/0282710 A1 Sep. 7, 2023

(30) Foreign Application Priority Data
Jun. 19, 2020 (FR) ........................... 2006416

(51) Int. Cl.
*H10D 62/85* (2025.01)
*H10D 30/01* (2025.01)
(Continued)

(52) U.S. Cl.
CPC ....... *H10D 62/8503* (2025.01); *H10D 30/015* (2025.01); *H10D 30/4732* (2025.01); *H10D 30/475* (2025.01); *H10D 62/824* (2025.01)

(58) Field of Classification Search
CPC ............. H10D 62/8503; H10D 30/475; H10D 30/015; H10D 30/4755
See application file for complete search history.

(56) References Cited

U.S. PATENT DOCUMENTS

| 2006/0202264 A1 | 9/2006 | Bhalla et al. |
| 2009/0166677 A1 | 7/2009 | Shibata et al. |
(Continued)

FOREIGN PATENT DOCUMENTS

| FR | 3 047 607 A1 | 8/2017 |
| JP | 2006-196869 A | 7/2006 |
| WO | WO 2020/001636 A1 | 1/2020 |

OTHER PUBLICATIONS

International Search Report as issued in International Patent Application No. PCT/EP2021/066138, dated Aug. 12, 2021.
(Continued)

*Primary Examiner* — Davienne N Monbleau
*Assistant Examiner* — Emily Farmer
(74) *Attorney, Agent, or Firm* — Pillsbury Winthrop Shaw Pittman LLP

(57) ABSTRACT

A micro-electronic device includes a first electronic component and a second electronic component, and a substrate formed of a first semiconductor material for supporting the components. The first component and the second component each include an active layer formed at least partially from a second semiconductor material different from the first semiconductor material. The device further includes, for each of the components, a stack for maintaining electrical voltage, which stack is situated between the substrate and the active layer of the electronic component under consideration and
(Continued)

which comprises two layers forming a junction P-N formed from the same semiconductor material as the substrate and which insulates the relevant active layer from the substrate. The assemblies respectively including the first component and the second component and their respective stack for maintaining electrical voltage are separated from each other by a barrier made of electrically insulating material.

15 Claims, 8 Drawing Sheets

(51) Int. Cl.
 *H10D 30/47* (2025.01)
 *H10D 62/824* (2025.01)

(56) References Cited

U.S. PATENT DOCUMENTS

| | | | | |
|---|---|---|---|---|
| 2012/0153300 | A1* | 6/2012 | Lidow | H01L 23/535 257/77 |
| 2013/0341641 | A1* | 12/2013 | Nishiwaki | H10D 84/08 257/77 |
| 2014/0264453 | A1* | 9/2014 | Moens | H01L 23/49575 257/194 |
| 2017/0148905 | A1* | 5/2017 | Tipirneni | H10D 84/01 |
| 2018/0166565 | A1* | 6/2018 | Chen | H10D 30/015 |
| 2018/0323265 | A1* | 11/2018 | Liu | H01L 21/0257 |
| 2020/0321432 | A1* | 10/2020 | Wei | H10D 62/108 |

OTHER PUBLICATIONS

Li, X., et al., "Suppression of the Backgating Effect of Enhancement-Mode p-GaN HEMTs on 200-mm GaN-on-SOI for Monolithic Integration," IEEE Electron Device Letters, vol. 39, No. 7, Jul. 2018, pp. 999-1002.

Zamir, S., et al., "Reduction of cracks in GaN films grown on Si-on-insulator by lateral confined epitaxy," Journal of Crystal Growth 243 (Year: 2002), pp. 375-380.

* cited by examiner (prior art)

MICRO-ELECTRONIC DEVICE WITH INSULATED SUBSTRATE, AND ASSOCIATED MANUFACTURING METHOD

CROSS-REFERENCE TO RELATED APPLICATIONS

This application is the U.S. National Stage of PCT/EP2021/066138, filed Jun. 15, 2021, which in turn claims priority to French patent application number 2006416 filed Jun. 19, 2020. The content of these applications are incorporated herein by reference in their entireties.

TECHNICAL FIELD OF THE INVENTION

The present invention relates to a microelectronic device comprising a substrate formed of a first semiconductor material, which serves as a support for a first and a second electronic component, such as transistors or diodes, each of which comprises an active layer formed at least in part of a second semiconductor material different from the first semiconductor material. In particular, it relates to such a microelectronic device, in which the components in question are high electron mobility transistors (or HEMTs) and/or Schottky diodes, for example based on gallium nitride (GaN).

TECHNOLOGICAL BACKGROUND OF THE INVENTION

A heterojunction is formed by the junction of two semiconductor materials having different energy gaps. For example, an AlGaN/GaN type heterojunction comprises a layer of gallium nitride (GaN) 11' having a layer of aluminium gallium nitride (AlGaN) 12' formed thereon (FIG. 1). A two-dimensional electron gas (2DEG) is formed at the interface 13' between the AlGaN layer and the GaN layer. This two-dimensional electron gas serves as a conduction channel in heterojunction electronic components such as so-called HEMT transistors and Schottky diodes.

An AlGaN/GaN heterojunction electronic component is generally manufactured on a semiconductor substrate 2', typically made of silicon Si, which serves as a support for the various components made. For this, a nucleation layer, one or more transition layers, possibly a thick buffer layer, and the layers of the heterojunction 11' (GaN, then AlGaN) are epitaxially grown successively.

This type of component withstands high current densities in the on-state, due to the high density of charge carriers (electrons) and the high mobility of these carriers in the two-dimensional electron gas. However, it suffers from a transient phenomenon of current collapse in the on-state. One explanation for this phenomenon is that electrons are trapped in the buffer layer and/or in the GaN or the passivation layers. These trapped electrons then deplete the two-dimensional electron gas back to the on-state, by capacitive coupling effect. The depletion of the two-dimensional electron gas leads to an increase in the dynamic on-state resistance of the component (and thus to a heating of the component and higher power losses in the same).

One technique for limiting electron trapping is to electrically connect the substrate 2' and the source S1 of the transistor, by a metal conductor 4', as is the case for the left-hand transistor 10' in FIG. 1.

The electric potential of the substrate 2' then remains equal to that of the source S1, or at least close to it. In this configuration, when the transistor 10a is off, with a high positive electric potential difference $V_{D1}-V_{S1}$ between the drain D1 and the source S1, the electric potential difference $V_{D1}-V_{Subs}$ between the drain D1 and the substrate 2' is also high and positive. Short-circuiting the source S1 and the substrate 2' thus makes it possible, when the transistor is off, to maintain a fairly strong electric field directed from the drain to the substrate, which prevents electrons from migrating towards the substrate 2' or the buffer layer and thus makes it possible to limit the trapping phenomenon mentioned above.

More generally, it is considered that an effective solution for limiting the "current collapse" effect consists in maintaining, for the substrate 2', an electric potential $V_{Subs}$ close to the electric potential $V_{S1}$ of the source of the transistor under consideration.

In the microcircuit of FIG. 1, two transistors 10a and 20a, made on the same silicon substrate 2', are electrically connected in series, one after the other. This configuration, with two transistors 10a, 20a of the same type connected in series to each other, the drain D1 of one being connected to the source S2 of the other, is sometimes referred to as a "half-bridge" or "bridge arm". This monolithic half-bridge configuration is very useful in the field of choppers and power conversion. In this configuration, it is not possible to have at all times:

a potential difference $V_{s1}-V_{Subs}$, between the source S1 of the first transistor 10a and the substrate 2', which is zero and also, a potential difference $V_{s2}-V_{Subs}$, between the source S2 of the second transistor 20a and the substrate 2', which is zero.

Indeed, this would amount to having $V_{S1}=V_{S2}$ at all times, and would therefore amount in some way to short-circuiting the first transistor 10'.

In other words, in the circuit of FIG. 1, it is not possible to both short-circuit the substrate 2' to the source S1 of the first transistor 10a (by means of the metal conductor 4'), and also short-circuit the substrate 2' to the source S2 of the second transistor 20a. Indeed, this would amount to short-circuiting both sources S1 and S2 of these transistors 10a, 20a, preventing the operation of the half-bridge.

In this structure, the current-collapse problem is therefore markedly apparent in the second transistor 20a, the so-called "high side" transistor.

To solve the trapping and "current collapse" problem in such a monolithic half-bridge structure, the article "Suppression of the Backgating Effect of Enhancement-Mode p-GaN HEMTs on 200-mm GaN-on-SOI for Monolithic Integration", by Xiangdong Li et al, IEEE Electron Device Letters, Vol. 39, No. 7, July 2018, pp 999-1002 (referred to simply as "Xiangdong Li et al." in the following) provides to make a half-bridge structure on a SOI substrate, that is "Silicon On Insulator" as represented in FIG. 2.

This structure comprises a substrate 2" covered with an electrically insulating layer 30" (of silica). It also comprises, on this insulating layer 30":

a first stack, comprising a first silicon layer 31" and, made on this first layer, the first transistor 10b (so-called "low side" transistor), and a second stack, comprising a second silicon layer 32" and, made on this second layer, the second transistor 20b (so-called "high side" transistor).

The first and second stacks are separated laterally and vertically from each other by a vertical barrier 33" and by the horizontal layer 30" of electrically insulating material. Each transistor 10b, 20b thus has, as it were, a silicon "local substrate" electrically insulated from the other transistor ("local substrate" consisting, for the first transistor 10b, of the first silicon layer 31", and for the second transistor 20*b*, of the second silicon layer 32").

By virtue of the electric insulation provided by the silica layer 30" and barrier 33", the source S2 of the second transistor 20*b* can then be electrically connected to the silicon layer on which it is formed (in this case the second silicon layer 32") to limit the current-collapse effect for this transistor, without short-circuiting the first transistor 10*b*.

This solution, based on an SOI-type support, has several drawbacks.

Firstly, it is expensive, as is often the case with semiconductor-on-insulator based solutions.

Secondly, the insulator layer in question, 30", creates a kind of thermally insulating barrier which prevents heat from escaping through the substrate 2' (the thermal conductivity of silica is about 100 times lower than that of silicon, at room temperature).

On the other hand, for GaN (or AlGaN) and silicon stacks on silica, significant cracking and peeling of the GaN and Si layers deposited on silica is observed as soon as their thickness reaches a few microns, as highlighted in the article "Reduction of cracks in GaN films grown on Si-on-insulator by lateral confined epitaxy", S. Zamir et al, Journal of Crystal Growth 243 (2002), pp 375-380 (see in particular FIGS. 1 and 2 of this article). As an example, for a silicon film of about 2 microns thickness on a silica layer of the same thickness, the (Al)GaN layer and the silicon film peel off when the thickness of the (Al)GaN layer is greater than about 0.7 microns.

These cracking and peeling phenomena then impose a small thickness on the GaN or AlGaN layers epitaxially grown on silicon. As this thickness is small, the device can only be used at low electric voltages and is therefore not adapted for power conversion and high electric voltages (of several hundred volts or more).

Documents US2017148905 and WO2020001636 each describe a half-bridge electronic device with two HMET type transistors separated from a common substrate by a P-N junction.

SUMMARY OF THE INVENTION

Within this context, it is therefore desirable, for a microelectronic device comprising at least two active layer electronic components such as diodes or transistors, in particular a GaN-on-Si type device, to solve the current-collapse problem for both components, with a technique that makes it possible to overcome one or more of the above-mentioned drawbacks of the solution described in the article by Xiangdong Li et al.

For this, a microelectronic device is provided comprising a first electronic component, at least a second electronic component, and a substrate serving as a support for said electronic components, the substrate being formed of a first semiconductor material, the first component and the second component each comprising an active layer formed at least in part of a second semiconductor material different from the first semiconductor material, the microelectronic device further comprising, for each of said components, an electric voltage maintenance stack:

which is located between the substrate and the active layer of the electronic component under consideration, and which comprises a first layer and a second layer which extend over each other, the first layer being located under the second layer, between the second layer and the substrate, the first layer being made from said first semiconductor material, with a doping, p or n, of the same type as for the substrate, whereas the second layer is made from said first semiconductor material, with a doping, n or p, of a type opposite to the doping of the substrate, the assembly comprising the first component and its electric voltage maintenance stack, and the assembly comprising the second component and its electric voltage maintenance stack being separated laterally from each other by a barrier of electrically insulating material.

As this barrier separates the assembly comprising the first component and its electric voltage maintenance stack from the assembly comprising the second component and its electric voltage maintenance stack, it extends at least to the substrate, and possibly even into this substrate.

Each electric voltage maintenance stack forms a P-N junction and thus acts as a diode, connected between the substrate and the rear face of the electronic component in question (for example transistor).

This diode allows the rear face of the electronic component it equips to be electrically insulated from the substrate, much like the silica layer of Xiangdong Li et al, but without the drawbacks of cost, thermal resistance and peeling posed by this silica layer.

The two diodes which thus equip the two electronic components of the device are connected in the same direction relative to the substrate, the forward direction of each diode corresponding, for example, to the direction from the substrate to the electronic component (in this case, the first layer, p-doped, constitutes the anode of the diode, the substrate is p-doped, and the electronic components are thus, for example, n-type transistors). In other words, these two diodes are electrically connected in anti-series to each other, with the midpoint between the two diodes corresponding to the substrate (see the example of the equivalent circuit diagram in FIG. 5A).

In particular, when the electronic components in question are diodes or transistors, this configuration makes it possible, in the event of alternating switching of the first and second components, to insulate the rear faces of the components from the common substrate, and thus, for each component, to maintain the rear face of the component at an electric potential close to that of the source electrode or the anode electrode of this component, independently of the electric potential of the common substrate, thereby limiting the "current-collapse" problem mentioned above.

Incidentally, the simulation results set forth in FIG. 5B show, for one example embodiment, that this structure with two diodes in anti-series makes it possible to effectively maintain the rear face of the component at an electric potential close to that of the source or anode electrode of this component, It should be noted that the double diode solution described above is quite different from that implemented in a transistor such as that described in document FR 3047607, in which an AlGaN/GaN heterojunction transistor comprises, between the GaN layer and a buffer layer (relatively insulating from an electric point of view), a GaN P-N junction. Indeed, in this document, this P-N junction serves to create, locally, an electric field that opposes the migration of electrons to the insulating buffer layer.

In the present patent application, the P-N junction plays a different role, which is to enable a given electric potential to be maintained or imposed for the rear face of the transistor (or diode), independently of the electric potential of the substrate.

Furthermore, the P-N junction is made here of the same semiconductor material as the substrate, for example silicon (Si), instead of being made of one of the materials of the AlGaN/GaN heterojunction of the transistor. And the P-N junction is made here under all the layers of the electronic component, including the possible transition layers and buffer layer, instead of being integrated into these layers, between the heterojunction and an insulating layer (as is the case in document FR 3047607).

It should also be noted that the structure set forth above, in which each component is associated with an electric voltage maintenance stack, allows easy integration, on a same substrate, of several electronic components, for example grouped by pairs. Indeed, this structure can be obtained by making a same planar P-N junction of silicon (formed by the first and second layers), on a whole part of a silicon substrate, then by making the different electronic components on this same P-N junction, finally cut by making a trench or trenches. The manufacture of this structure is therefore convenient, and in fact quite similar to the manufacture of a conventional structure made directly on a silicon substrate.

Integrating several pairs of heterojunction components on the same substrate makes it possible, in particular, to make complete monolithic switching bridge arms, such a bridge including two transistors and two diodes connected in parallel with the transistors. This also makes it possible, among other things, to make monolithic multiphase, for example three-phase, inverters including several (for example three) bridge arms connected in parallel with each other, across a DC electric voltage source.

In addition to the characteristics indicated above, the microelectronic device according to the invention may have one or more complementary characteristics among the following, considered individually or in any technically possible combination:
  for each electric voltage maintenance stack, the volume concentration of dopant element in the second layer varies gradually as a function of the distance separating the first layer from the point under consideration in the second layer, said concentration increasing with said distance;
  said concentration increases with said distance with a rate of variation between $10^2$ and $10^5$ per micron;
  for each electric voltage maintenance stack, the volume concentration of dopant elements in the first layer is lower than the volume concentration of dopant elements in the substrate, for example less than one hundredth or even one thousandth of the volume concentration of dopant elements in the substrate;
  the active layer of each of said components comprises a heterojunction;
  this heterojunction includes:
    a third layer, formed at least in part of said second semiconductor material, and
    on the third layer, a fourth layer formed at least in part of a third semiconductor material, the second and third semiconductor materials having different energy gaps;
  the first semiconductor material is based on silicon;
  the second semiconductor material is based on Gallium nitride;
  the third layer is made in the form of a stack comprising a sublayer based on AlN, for example of AlN, a superlattice based on AlGaN sublayers and GaN sublayers (that is, a periodic stack of such alternating sublayers of small thicknesses) and a sublayer based on GaN, for example of GaN;
  the third and fourth layers extend against each other;
  the third semiconductor material is appropriate for obtaining a two-dimensional electron gas confined between the third layer and the fourth layer;
  the third semiconductor material is based on aluminium gallium nitride;
  the device further comprises, for each of said components, a stack of transition layers and/or a buffer layer, interposed between the electric voltage maintenance stack on the one hand, and the active layer of the electronic component under consideration on the other hand;
  for each electric voltage maintenance stack, the first layer has a thickness greater than 20 microns;
  for each electric voltage maintenance stack, the second layer has a thickness of between 1 and 5 microns;
  the concentration of dopant species in the substrate is such that the electrical conductivity of the substrate at room temperature is greater than 1 siemens per centimetre;
  the concentration of dopant species in the substrate and the thickness of the substrate are such that the conductance per unit area of the substrate, at room temperature, in a conduction direction perpendicular to the substrate, is greater than 0.1 siemens per square millimetre;
  said first material being Silicon Si, the volume concentration of p-type dopant elements in the substrate is greater than $2.10^{16}$ elements per cubic centimetre, or even greater than $10^{17}$ elements per cubic centimetre;
  each of the first and second components comprises a first electrode and a second electrode connected to each other by the active layer of the component;
  the second electrode of the first component is connected to the first electrode of the second component by a metal conductor;
  the first electrode of each of said components is connected by a metal conductor to the second layer of the electric voltage maintenance stack associated with this component;
  the first electrode of the first component is connected to the substrate by a metal conductor;
  each of said components is a transistor, the first electrode of the component being a source electrode whereas its second electrode is a drain electrode;
  each of said components is a diode, the first electrode of the component being an anode electrode whereas its second electrode is a cathode electrode;
  the device comprises, in addition to the pair of components grouping the first and second components, an additional pair of components grouping an additional first component and an additional second component, said pair of components and said additional pair of components being both made on the same substrate and being electrically connected in parallel to each other, the additional first and second components each being separated from said substrate by an electric voltage maintenance stack as described above;
  the first and second components are transistors and the first and second additional components are diodes, each connected in parallel to the first component and, respectively, to the second component, the anode of the diode under consideration being connected by a metal conductor to the source of the transistor under consideration, whereas the cathode of this diode is connected by a metal conductor to the drain of said transistor, said pair of components and said additional pair of components forming a complete switching bridge arm;

the device comprises several complete switching bridge arms as described above, for example three or six complete bridge arms, made on the same substrate and connected in parallel with each other, the device being a multi-phase, for example three-phase, inverter.

Another aspect of the invention relates to a method for manufacturing a microelectronic device made on a substrate formed of a first semiconductor material, the method comprising the following steps of:

making a layer, which extends over the substrate and which is formed of said first semiconductor material, with a doping, p or n, of the same type as for the substrate, and then making an additional layer, which extends over said layer and which is formed of said first semiconductor material, with a doping, n or p, of the type opposite to the doping of the substrate, and then making a first electronic component and at least a second electronic component, each of which extends over said additional layer, the first component and the second component each comprising an active layer formed at least in part of a second semiconductor material different from the first semiconductor material, making a trench, which laterally separates the first component from the second component, said trench extending vertically through said layer and said additional layer to delimit:

a first electric voltage maintenance stack, located between the first component and the substrate, and a second electric voltage maintenance stack, located between the first component and the substrate, each of said stacks comprising a first layer and a second layer which extend over each other, the first layer and the second layer being delimited by said trench in said layer and in said additional layer respectively, and filling said trench with an electrically insulating material.

It can be provided that the step of making the first component and the second component comprises, for each component, making a first electrode and a second electrode connected to each other by the active layer of the component under consideration, the method further comprising the following step of:

for each component, making a metal connection electrically connecting the first electrode of the component under consideration to the second layer of the voltage maintenance stack associated with said component.

The method in question could further comprise the following steps of:

making a bonding trench, which extends vertically from the first component to the substrate by passing through said layer and said additional layer, depositing an insulating material covering the side walls of said bonding trench, or filling the bonding trench with an insulating material, and then making a metal connection which extends through the bonding trench and electrically connects the substrate to the first electrode of the first component.

The invention and its various applications will be better understood upon reading the following description and upon examining the accompanying figures.

BRIEF DESCRIPTION OF THE FIGURES

The figures are set forth for indicating and in no way limiting purposes of the invention.

DETAILED DESCRIPTION

Figure 1:
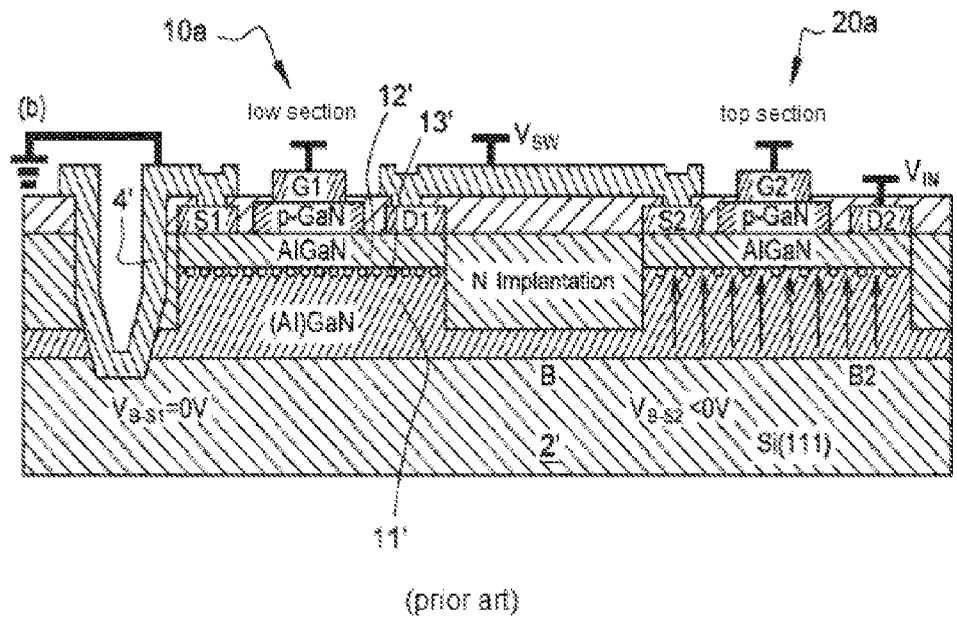
FIG. 1 schematically represents a bridge arm of the state of the art, comprising two HEMT type transistors made on a silicon substrate, in a cross-section and side view.
Figure 2:
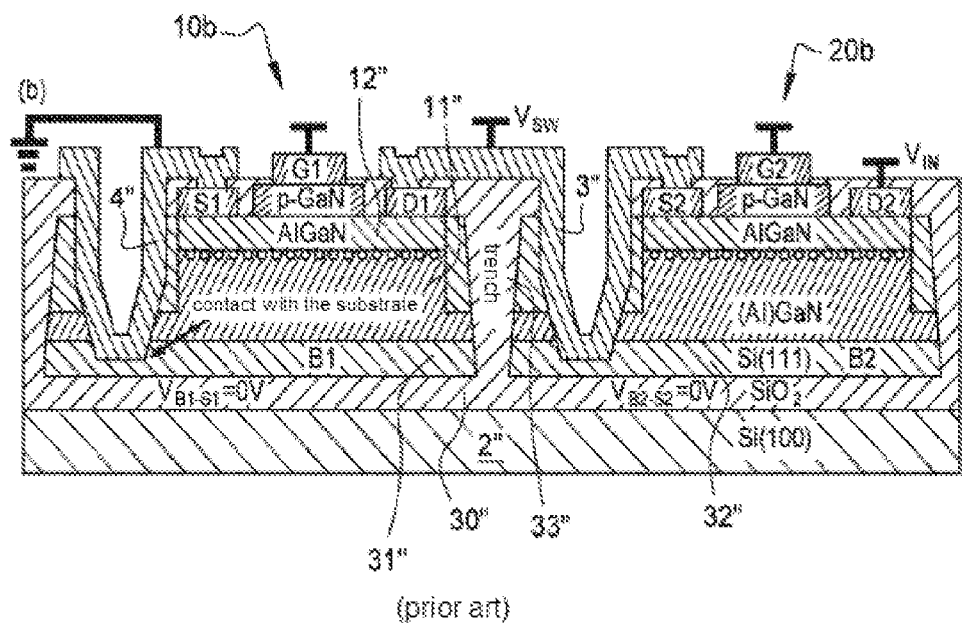
FIG. 2 schematically represents another bridge arm of the state of the art, comprising two HEMT type transistors made on a silicon-on-insulator (SOI) type substrate, in a cross-section and side view.
Figure 3:
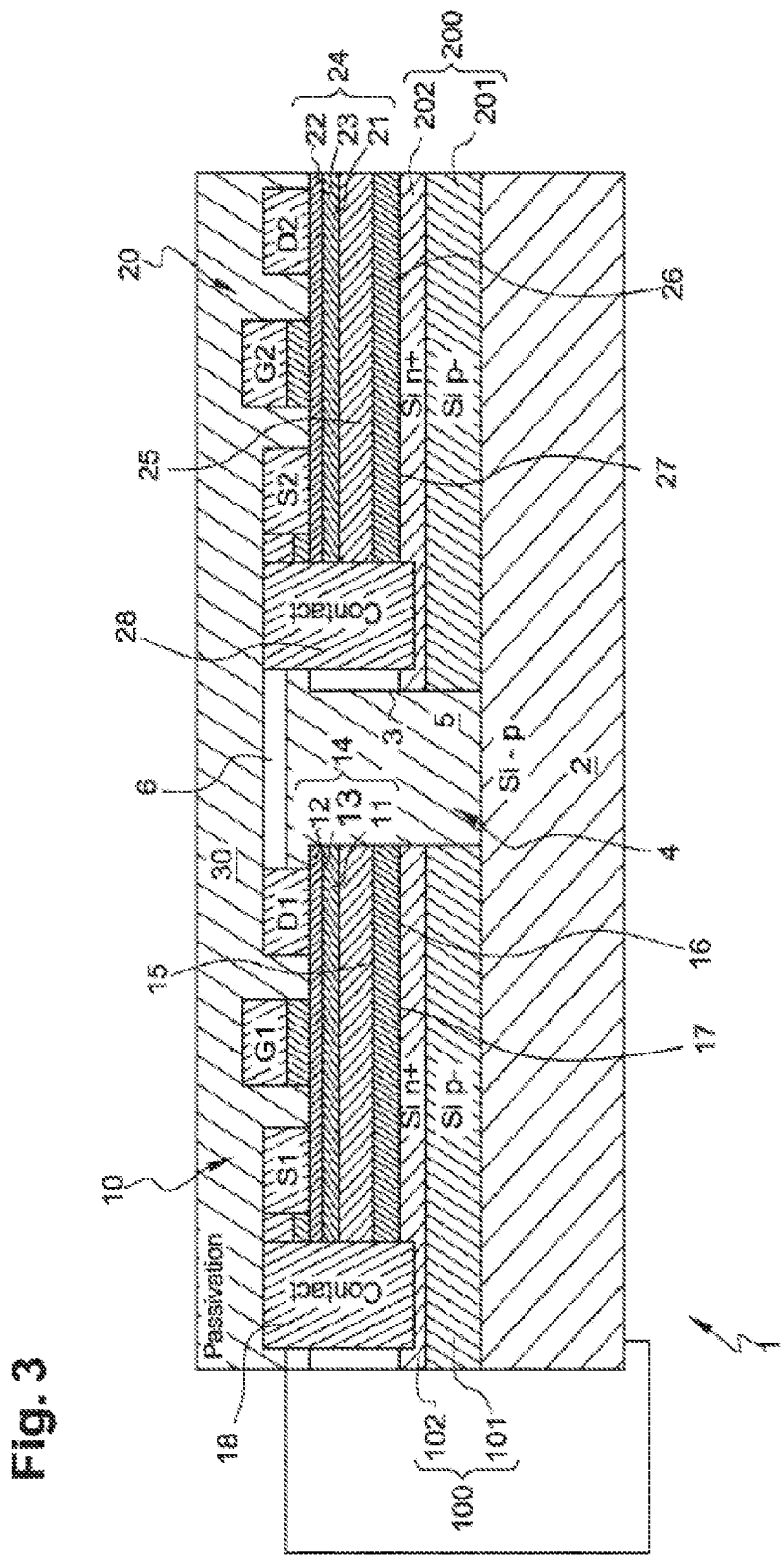
FIG. 3 schematically represents a bridge arm implementing the teachings of the invention, made on a silicon substrate and comprising a first and a second transistor, in a cross-section and side view.

FIG. 3 schematically represents a microelectronic device 1 comprising a first electronic component 10 and a second electronic component 20, as well as a substrate 2 serving as a support for these components.

The substrate 2 is formed of a first semiconductor material, and the first and second components 10 and 20 each comprise an active layer 14, 24 formed at least in part of a second semiconductor material different from the first semiconductor material.

Remarkably, the rear faces 17 and 27 of these components are electrically insulated from the substrate by layers 101 and 102, or 201 and 202 respectively, which form P-N junctions.

Here, the first semiconductor material, which forms the substrate 2, is based on silicon Si. More specifically, it is p-type doped silicon. The second semiconductor material, which forms at least part of the active layers 14 and 24 of the components 10 and 20, is based on gallium nitride GaN. The device 1 is thus made by means of a GaN-on-silicon technique.

The components 10 and 20, which are for example diodes or transistors, are here heterojunction components. The active layer 14, 24 of each of these two components 10, 20 thus comprises a heterojunction which includes:

- a layer, hereinafter referred to as the third layer 11, 21, formed of the second semiconductor material in question (here GaN), and
- on the third layer 11, 21, another layer, hereinafter referred to as the fourth layer 12, 22, formed of a third semiconductor material having an energy gap different from the energy gap of the second semiconductor material.

A two-dimensional electron gas 13, 23, confined between the third layer 11, 21 and the fourth layer 12, 22 is thus obtained. Due to the high density of charge carriers (electrons) and the high mobility of these carriers in the two-dimensional electron gas 13, 23, the components 10 and 20 are able to withstand high electric currents in the on-state.

In the example represented in FIG. 3, the second semiconductor material is unintentionally doped gallium nitride GaN. The third material is based on aluminium gallium nitride AlGaN. Here, in this case, the third material is even made entirely of aluminium gallium nitride AlGaN.

In other embodiments, the third semiconductor material could be a semiconductor material different from AlGaN, and appropriate for obtaining a two-dimensional electron gas confined between the third layer 11, 21 and the fourth layer 12, 22. It could be, for example, AlN.

Moreover, the third layer 11, 21 and the fourth layer 12, 22 here extend against each other, and the two-dimensional electron gas 13, 23 is confined directly at the interface between these two layers. Alternatively, however, a thin intermediate layer (for example of aluminium nitride AlN) could be interposed between the third and fourth layers.

The first and second components 10 and 20 each comprise a first electrode S1, S2 and a second electrode D1, D2 electrically connected to each other by the active layer 14, 24 of the component under consideration. The first electrode S1, S2 and a second electrode D1, D2 are, for example, made on an upper face of the active layer 14, 24. However, they may be partially buried in the active layer 14, 24.

The active layer 14, 24 extends laterally from the first electrode S1, S2 to the second electrode D1, D2, or at least from the first electrode S1, S2 to a gate G1, G2, or possibly from the second electrode D1, D2 to the gate G1, G2. The active layer 14, 24, in which a conduction channel can be formed (channel such as the above-mentioned two-dimensional electron gas 13, 23), thus makes an electrical, possibly controllable connection (via a third, gate, electrode) between the first electrode S1, S2 and the second electrode D1, D2 of the respective component.

Here, the first and second components 10, 20 are (n-type) transistors, and the first electrode S1, S2 is a source electrode whereas the second electrode D1, D2 is a drain electrode. Each of these components 10, 20 also comprises a gate electrode G1, G2, for controlling the transistor in an on-state, or in an off-state. The gate electrode is for example separated from the active layer 14, 24 by a layer of insulating oxide, by a layer of p-doped gallium nitride GaN or by an etching made in the fourth layer 12, 22 (the gate being then formed in a recess in the fourth layer 12, 22).

A passivation layer 30 covers the active layers 14 and 24. This passivation layer 30 also covers at least part of the above-mentioned electrodes. The passivation layer 30 may, for example, be made of silicon nitride ($Si_3N_4$) or, as here, silica (that is, silicon dioxide $SiO_2$), or preferably in the form of a stack of silicon nitride and silica.

In other embodiments, the first and second components could be components other than transistors, for example diodes. In the latter case, the first electrode would then be an anode electrode, whereas the second electrode would be a cathode electrode of the diode in question. Such a diode can, for example, be made from a structure similar to that of the transistors set forth above, by connecting the gate electrode to the source electrode by a metal conductor.

In any case, here, the first and second components 10, 20 are power components capable of withstanding high electric voltages, greater than 100 volts or even greater than 500 volts. In order to be able to withstand these electric voltages, the assembly comprising the third layer 11, 21 made of Gallium nitride GaN and the buffer layer 15, 25 has a relatively large thickness, typically between 2 microns and 6 microns. As an example, when the device 1 is intended to cut off a nominal DC electric voltage of 650 volts, a thickness of 5 microns+/−1 micron can be provided for the assembly comprising the third layer 11, 21 of GaN and the buffer layer 15, 25.

Moreover, the first and second components 10, 20, through which significant electric power may flow (the intensity of the current passing through them may reach 30 amperes), each occupy, parallel to the substrate 2, a surface whose area is relatively large, for example greater than or equal to 1 square millimetre. The surface in question is, for example, the surface which extends under and between the first S1, S2 and second electrodes D1, D2, or which is delimited laterally by isolation trenches such as the trench 3 visible in FIG. 3.

Each of the first and second components 10, 20 may also comprise a buffer layer 15, 25 which extends under its active layer 14, 24 (therefore between the active layer 14, 24 and the substrate), for example just under the active layer, against it. The semi-insulating buffer layer 15, 25 is for example formed of carbon-doped GaN. Such a buffer layer, several microns thick, allows lateral and vertical leakage currents in the device to be limited and the two-dimensional electron gas of the heterojunction to be better confined.

Each of the first and second components 10, 20 further comprises a stack of transition layers 16, 26. This stack of transition layers is located under the active layer 14, 24. Here, it is located more precisely under the buffer layer 15, 25.

The stack of transition layers allows the lattice parameter to be adapted and the mechanical stresses to be managed between:
- on the one hand, the substrate 2, or layers made directly on the substrate, based on silicon Si, and
- on the other hand, the layers of the electronic components, for example the third GaN layer, or, as here, the buffer layer 15, 25.

The stack of transition layers may comprise a nucleation sublayer (for example, a 100 nm thick AlN layer), and over that, several matching sublayers stacked over the nucleation sublayer. The matching sublayers comprise, for example, AlGaN, the aluminium content of which varies from layer to layer.

Thus here, each of the first and second components 10, 20 comprises the active layer 14, 24, the above-mentioned electrodes S1, D1, G1, or S2, D2, G2, and the accompanying layers formed by the buffer layer 15, 25 and the transition stack 16, 26. The lower face of the stack of transition layers 16, 26 (the face located on the side of the substrate 2) forms the rear face 17, 27 of the component.

The microelectronic device 1 also comprises, for each of said components 10, 20, an electric voltage maintenance stack 100, 200:

which is located between the substrate 2 and the active layer 14, 24 of the electronic component 10, 20 under consideration, and which comprises a first layer 101, 201 and a second layer 102, 202 which extend over each other, the first layer 101, 201 being located under the second layer, between the second layer 102, 202 and the substrate 2.

The first layer 101, 201 is made from the same semiconductor material as the substrate 2, in this case silicon, and with a doping of the same type as for the substrate 2, in this case p-type doping.

As for the second layer 102, 202, it is made from the same semiconductor material as the substrate (therefore, silicon in this case), but with an opposite doping to that of the substrate 2 (therefore, an n-type doping in this case).

This electric voltage maintenance stack 100, 200 thus forms a P-N junction and acts as a diode, connected between the substrate 2 and the rear face 17, 27 of the electronic component 10, 20 under consideration. The interest of this arrangement will be set forth below, after describing the whole device.

In the embodiment represented in the figures, for each of these voltage maintenance stacks 100, 200, the second layer 102, 202 extends directly against the first layer 101, 201.

Moreover, here, the first layer 101, 201 is not only made from p-doped silicon, but is even entirely formed from p-doped silicon. Similarly, the second layer 102, 202 is entirely formed from n-doped silicon, here.

A barrier 4 of electrically insulating material, for example silica $SiO_2$, laterally separates:

the assembly comprising the first component 10 and its electric voltage maintenance stack 100 from the assembly comprising the second component 20 and its electric voltage maintenance stack 200.

Each of these two assemblies can also be laterally delimited, along its entire perimeter, by such insulating barriers.

The barrier 4 in question is obtained:

by making a trench 3 which extends vertically, that is, perpendicularly to the substrate 2, from an upper face of the electronic components to the substrate 2, and then by filling this trench 3 with the insulating material 5 in question.

The first and second components 10, 20 are electrically connected to each other by a metal conductor 6 which connects:

the second electrode D1 of the first component 10 (therefore its drain electrode, here), with the first electrode S2 of the second component 20 (source electrode of the second transistor).

The assembly comprising the first and second components 10 and 20 thus forms a switching "bridge arm".

This bridge arm makes it possible, for example, to obtain, at the midpoint between the two transistors 10 and 20, that is, at the metal conductor 6, a cut off electric voltage of the PWM type (that is, "Pulse Width Modulation", or cyclic ratio modulation). For this, a voltage source, which supplies a DC supply electric voltage, is connected between the drain electrode D2 of the second transistor 20 (generally referred to as the "high side" transistor) on the one hand, and the source electrode S1 of the first transistor 10 (generally referred to as the "low side" transistor) on the other hand. The first and second transistors 10 and 20 are then driven to pass alternately to their on- or off-states.

As already indicated, each electric voltage maintenance stack 100, 200 acts as a diode, connected between the substrate 2 and the rear face 17, 27 of the electronic component 10, 20 under consideration.

This diode electrically allows the rear face 17, 27 of the component 10, 20 that it equips, to be electrically insulated from the substrate 2. It does not have the drawbacks of cost, thermal resistance and peeling that the silica insulating layer described in the above-mentioned article by Xiangdong Li et al has.

For each of these two diodes, the forward direction of the diode is directed from the substrate 2 to the electronic component 10, 20 that it equips. These two diodes are therefore electrically connected in anti-series (head-to-tail) to each other, with the midpoint A between the two diodes corresponding to the substrate 2 (see the example of equivalent circuit diagram in FIG. 5A).

This configuration makes it possible, in particular, during alternate switching of the first and second transistors 10, 20 of the device 1, to insulate the rear faces 17, 27 of these transistors from the common substrate 2, and thus, for each transistor, independently of the other, to maintain its rear face 17, 27 at an electric potential close to that of its source electrode S1, S2 (or that of its anode electrode, in the case of a diode). As explained in the section entitled "Summary of the invention", maintaining the rear face 17, 27 of each transistor at an electric potential close to that of its source electrode effectively limits the trapping and current-collapse problem, in such a GaN-on-Si device, particularly for heterojunction devices such as those described above.

Now that the overall structure of the device 1 has been set forth, let us return in more detail to the structure of these voltage maintenance stacks 100, 200.

For each of these stacks 100, 200, the first layer 101, 201 has here a thickness e1 between 20 and 100 microns. As an example, when the device 1 is intended to cut off a nominal DC electric voltage of between 500 and 800 volts, a thickness of between 50 and 80 microns is well adapted, for the first layer 101, 201.

In terms of doping, the p-type first layer 101, 201 is relatively lightly doped. In particular, it is less doped than the substrate itself. In the first layer 101, 201, the volume concentration of p-type dopant elements, for example Boron, is typically between $10^{13}$ elements per cubic centimetre (for example $10^{14}$ Boron atoms per cubic centimetre) and $10^{15}$ elements per cubic centimetre.

The moderate thickness of the first layer 101, 201, here less than 100 microns, makes it possible to limit the additional electric resistance introduced by this layer, which is fairly lightly doped.

But the fact that this thickness remains quite large, greater than at least 20 microns, helps to limit the amplitude of the electric field in the P-N junction formed by the stack 100, 200 in question.

This aspect is of particular importance here. Indeed, for this bridge arm device 1 with two components 10, 20 separated by the insulating barrier 4, the amplitude of the electric field may locally have a high value, at the junction between the first layer 101, 201 and the second layer 102, 202, on the side of the insulating barrier. In other words, there may be a concentration of equipotential lines in the vicinity of the boundary F between the first layer 101, 201, the second layer 102, 202, and the insulating barrier 4 (triple boundary). This effect is visible in FIG. 4, which shows the amplitude of the electric field, obtained by digital simulation, for an example reproducing what could occur between adjacent electrodes D1 or D2 of two bridge arms such as 1 when their midpoints are at potentials 0 and VP respectively or vice versa.

As for the second layer 102, 202, its thickness e2 is for example between 1 and 10 microns, preferably between 1 and 5 microns. This thickness, greater than 1 micron, is greater than the typical thickness over which aluminium from the epitaxially grown AlN is likely to diffuse into the silicon.

In terms of doping, the second layer 102, 202 is an n+ type layer, with an n-type doping which is therefore quite high. In this layer, the average volume concentration of n-type dopant elements, for example Phosphorus, may thus be between $10^{16}$ elements per cubic centimetre and $10^{20}$ elements per cubic centimetre, as an example.

And it can be provided, as here, that the volume concentration of dopant elements, of n-type, varies gradually as a function of the distance d separating the first layer 101, 201, on the one hand, and the point P under consideration in the second layer 102, 202 on the other hand. In this case, this concentration increases with the distance d (in other words, in the second layer 102, 202, this concentration decreases as the first layer 101, 201 is getting closer). This gradual variation also contributes to limiting the amplitude of the electric field in the P-N junction formed by the junction of the first and second layers.

In the second layer 102, 202, this gradual variation in the concentration of dopant may be continuous (that is: completely progressive) or may take place in discrete stages. In the latter case, the second layer comprises several sub-layers (for example, at least 3 or even at least 4), each of which is homogeneous, with a concentration of dopant that varies, in stages, from one sub-layer to the next.

In any case, in the second layer 102, 202, the concentration of dopant (here n-type), or at least a local average concentration of dopant, preferably varies with a rate of variation of between $10^2$ and $10^5$ per micron (said average being, for example, a local average over a distance—or in other words, a thickness—, for example, of between ¼ and 1/20 of the total thickness of the layer 102, 202). In other words, the relative variation in this concentration, per unit length, is between $10^2$ and $10^5$ per micron (average rate of variation, over the whole layer 102, 202). Preferably, the concentration of dopant, or at least the local average concentration of dopant, varies with a rate of variation that remains between these two bounds over the whole layer 102, 202 (that is, over its entire thickness). At the point where it is the lowest, the concentration of dopant (here n-type) in the layer 102, 202 may, as here, be greater than $10^{14}$ per cm$^3$, for example between $10^{14}$ and $10^{17}$ per cm$^3$.

As for the substrate 2, it has a thickness of, for example, between 0.3 millimetres and 1 millimetre, and in any case greater than 0.1 millimetre (if only for reasons of solidity). As will be illustrated by the results of digital simulations carried out for equivalent electric circuits, it is desirable to reduce the electric resistance of the substrate as much as possible, in order to effectively maintain the rear face 17, 27 of the transistors 10, 20 at a potential close to that of their source electrodes S1, S2, including upon switching of these transistors.

In practice, a resistance value of 10 Ohms or less proves to be well adapted for the part of the substrate 2 located in the extension of the first device 10, or of the second device 20 (in line with this component; this is the resistance of this part of the substrate 2, in a conduction direction perpendicular to the substrate). Given the dimensions of the substrate (typical substrate thickness of 1 mm), and of the components 10, 20 in question (typical surface area, per component, of 1 mm$^2$), an electrical conductivity of the substrate greater than 1 siemens per centimetre, at room temperature (that is, at 20 degrees Celsius), is therefore well adapted. This can be obtained here by doping the silicon substrate with a concentration of p-type dopant elements greater than $2.10^{16}$ elements per cubic centimetre. It is even possible to choose a concentration greater than $10^{17}$ elements per cubic centimetre (in the case of the digital simulation in FIG. 4, this concentration is equal to $10^{16}$ elements per cubic centimetre).

Figure 4:
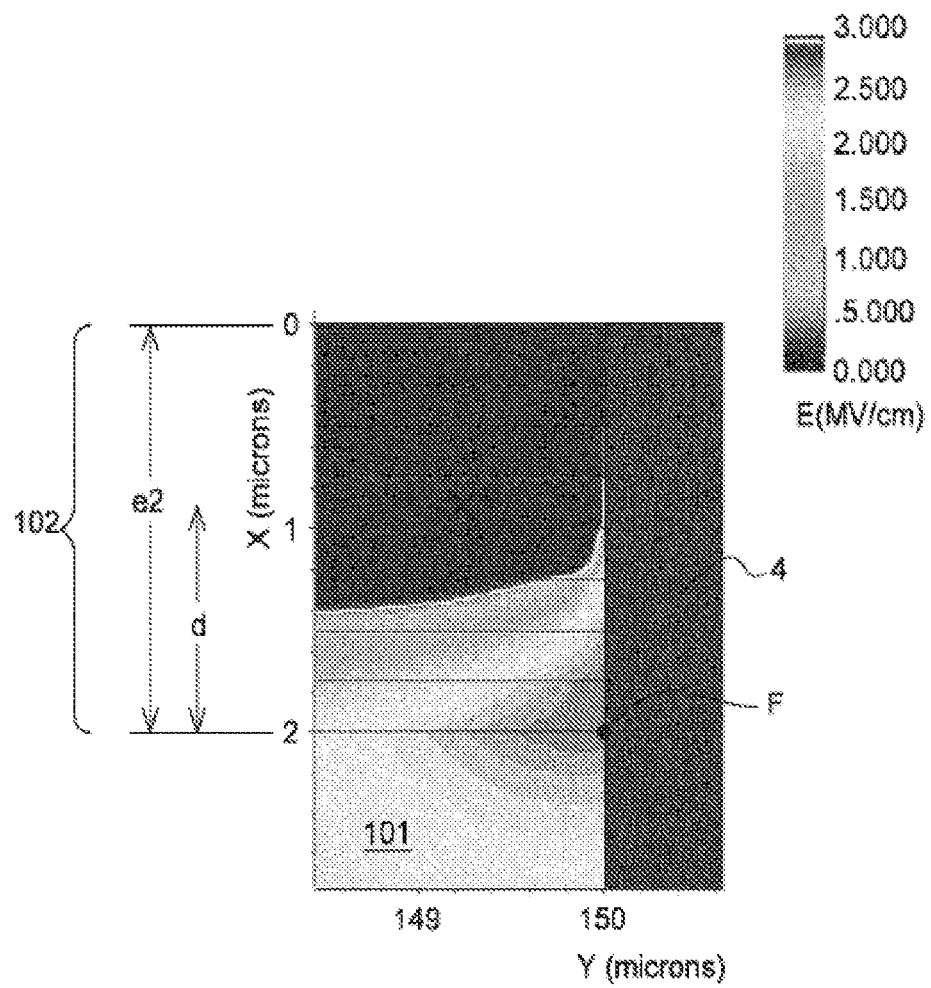
FIG. 4 shows the amplitude of the electric field at different points in a voltage maintenance stack of the bridge arm of FIG. 3.

FIG. 4 shows the amplitude E of the electric field obtained by digital simulation, in the voltage maintenance stack 100 of the first transistor 10, in a case where:

the thickness e1 of the first layer 101, 201 is 50 microns, with a doping of $10^{14}$ dopant elements (p-type) per cubic centimetre, the thickness e2 of the second layer 102, 202 is 2 microns, this layer being formed by a stack of 8 sub-layers, each 0.25 microns thick, with a concentration of dopant elements (n-type) which varies from $10^{15}$ elements per cubic centimetre for the lowest sub-layer, to $5\times10^{19}$ elements per cubic centimetre for the upper sub-layer of the second sub-layer 102, 202 the concentration of dopant elements (p-type) is $10^{18}$ dopant elements per cubic centimetre in the substrate, and the width of the insulating barrier 4, made of silica, is 100 microns.

Moreover, from an electric point of view, this simulation corresponds to a case reproducing what could happen between adjacent electrodes D1 or D2 of two bridge arms such as the bridge arm 1 when their midpoints are at potentials 0 and VP respectively or vice versa. A DC electric voltage, which is in this case 650 volts, is applied between the drain electrode D2 and the source electrode S1. As for the substrate, the same electric potential as for the source electrode S1 is imposed thereto.

These operating conditions are chosen for this simulation because they are the most constraining conditions for the electric voltage maintenance stack 100, in terms of electric field values (the electric potential variations being strong both vertically and laterally).

In FIG. 4, the stack 100 is seen in a cross-section and side view. Distances are indicated in microns, and electric field values are indicated in Megavolts per centimetre.

As can be seen in this figure, under the conditions indicated above, the maximum electric field value in the stack 100:

is obtained in the vicinity of the boundary F between the n+ doped first layer 101, the p-doped second layer 102, and the insulating barrier 4, and is about 0.27 Megavolts per centimetre.

These results show that, for these parameters, the stack 100 is well adapted to the "high voltage" switching device 1 it equips, since the maximum value reached by the electric field in this stack (of 0.27 Megavolts per centimetre), remains lower than the breakdown electric field in silicon (which is about 0.3 Megavolts per centimetre). A higher electric field value of about 0.3 Megavolts per centimetre is achieved in the silica barrier, but silica has a breakdown electric field which is higher.

Moreover, a simulation carried out under the same conditions as for FIG. 4, but with a thickness e1 of 60 microns for the first layers 101 and 201, instead of 50 microns, shows that the maximum electric field value achieved in the stack 100 is then 0.24 Megavolts per centimetre, instead of 0.27, which clearly shows the interest in choosing a fairly large thickness for the first layers 101 and 201.

As represented, the device 1 also comprises, for each of the two components 10 and 20, a metal conductor 18, 28 which connects (FIGS. 3 and 13):
    the first electrode Si, S2 of this component 10, 20, to
    the second layer 102, 202 of the voltage maintenance stack 100, 200 associated with this component 10, 20.

Figure 11:
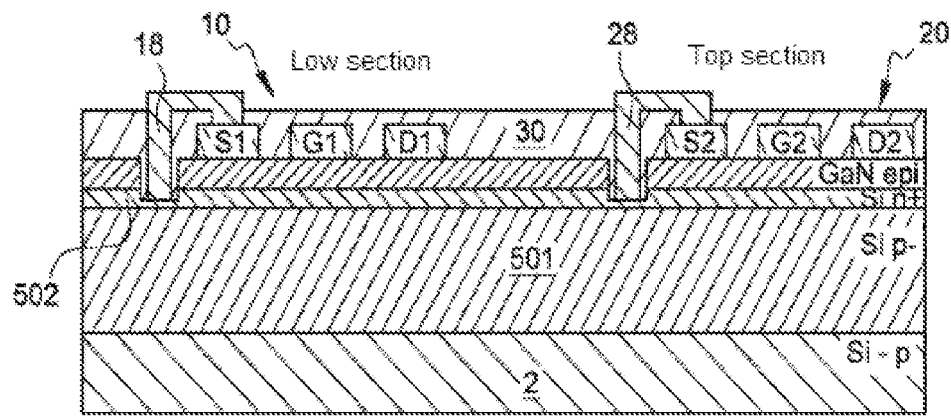
FIG. 11 schematically represents the bridge arm of FIG. 3 being manufactured, at another stage of its manufacture, in a cross-section and side view.
Figure 12:
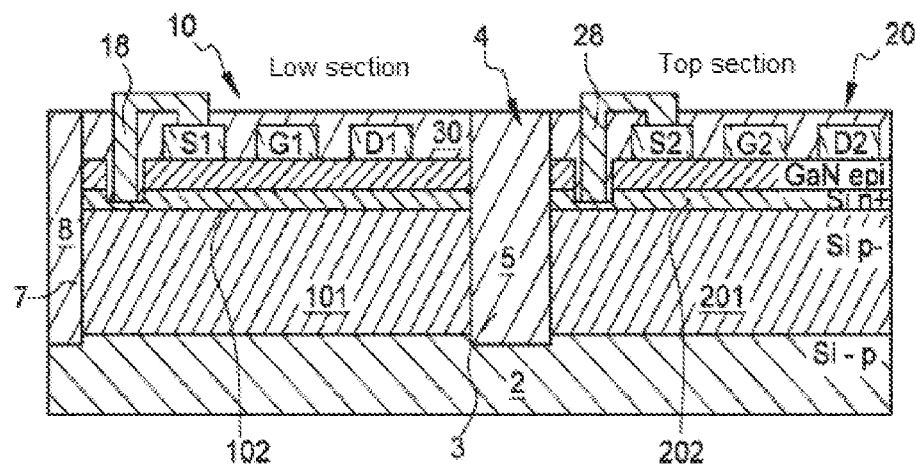
FIG. 12 schematically represents the bridge arm of FIG. 3, at a later stage of its manufacture, after making the isolation trench in question, in a cross-section and side view.

This electrical connection is obtained, for example, by making a trench with insulated flanks, which extends vertically to the second layer 102, 202, and then making the metal conductor 18, 28 in question, which extends from the electrode S1, S2 to the second layer 102, 202, through this trench (FIGS. 11-12).

This electrical connection makes it possible to maintain the electric potential of the rear face 17, 27 of each of these components 10, 20 at a value close to that of the potential of the first electrode S1, S2 of this component. By virtue of the electric voltage maintenance stack, which provides electric insulation between this rear face 17, 27 and the substrate 2, this connection can be made without the risk of short-circuiting the first electrodes S1 and S2 of the two components 10 and 20.

It may also be provided, as in this case, to connect by a metal conductor 9
    the first electrode S1 of the first component 10, and
    the substrate 2.

Figure 13:
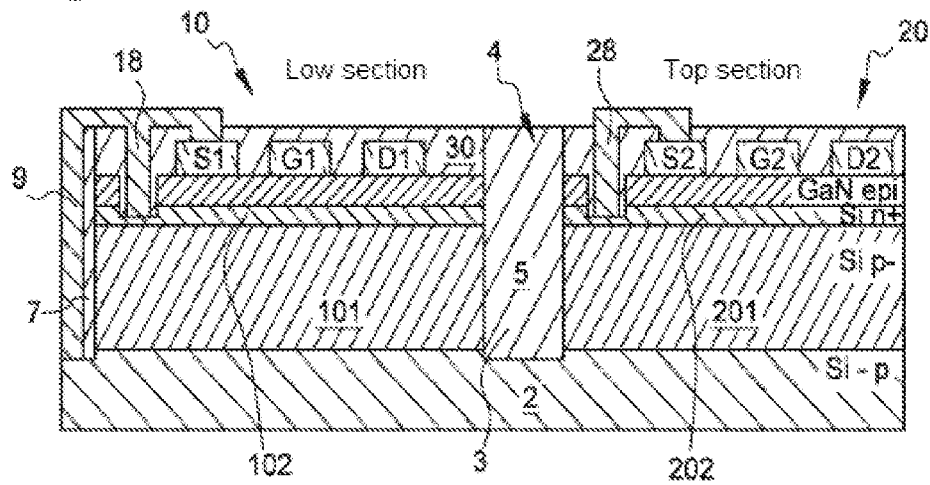
FIG. 13 schematically represents the bridge arm of FIG. 3, at another stage of its manufacture, after making a metal connection connecting a source electrode of the first transistor to the substrate, in a cross-section and side view.

Here again, this electrical connection can be obtained by making a bonding trench 7, with electrically insulated flanks, which extends vertically to the substrate 2 (FIG. 12), and then by making the metal conductor 9 in question, which extends from the electrode S1 to the substrate 1 through this bonding trench 7 (FIG. 13). Alternatively, however, this connection could be made externally, by a metal conductor connecting the electrode S1 to a rear face of substrate 2, without passing through the device 1 (outside the chip, and inside the packaging).

This electrical connection between the substrate 2 and the first electrode S1 of the first component 10 also contributes to maintaining the electric potential of the rear face 17, 27 of each of the two components 10 and 20 at a value close to that of the potential of the first electrode S1, S2 of the component in question.

Figure 5A:
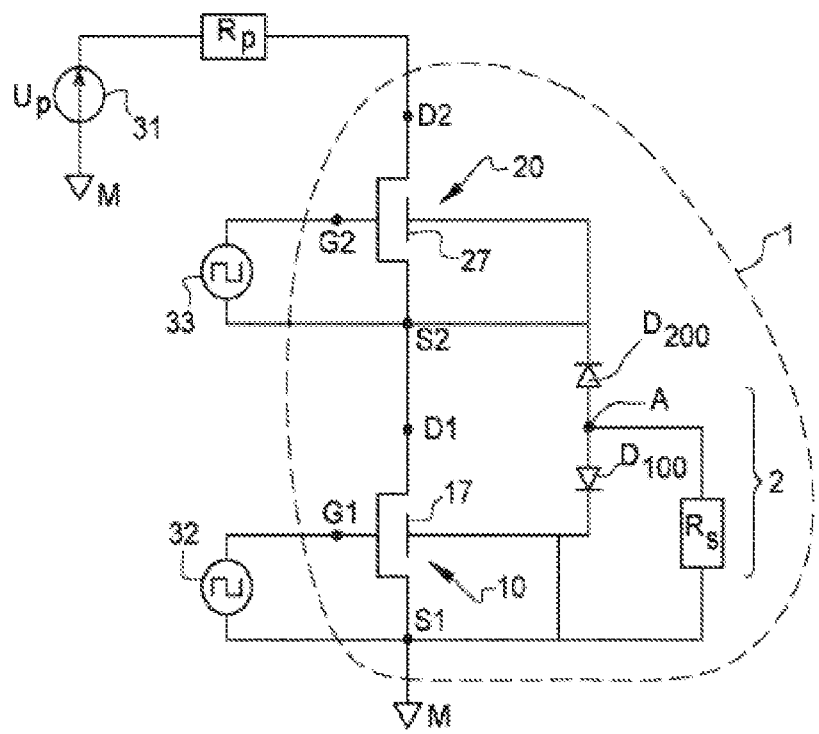
FIG. 5A is a diagram of an equivalent electric circuit, representing a power supply system fitted with the bridge arm of FIG. 3.

FIG. 5A is a diagram of an equivalent electric circuit that models a power supply system comprising:
    the switching bridge arm, 1, of FIG. 3,
    a DC voltage source 31, which supplies a power supply voltage Up, to be cut off by the bridge arm 1 (for example to power an electric motor), and
    square-wave voltage sources 32 and 33, to drive the gate voltages of the transistors 10 and 20 of the bridge arm.

This equivalent electric circuit serves as a basis for performing digital simulations of the operation of the device 1, under operating conditions.

In this equivalent circuit, the bridge arm 1 is represented by:
    two HEMT type AlGaN/GaN heterojunction transistors which represent the first and second transistors 10 and 20 of FIG. 3 (the drain electrode D1 of the first transistor 10 being connected by an electric conductor to the source electrode S2 of the second transistor 20),
    two diodes D100 and D200, which represent the voltage maintenance stack 100 of the first transistor and the voltage maintenance stack 200 of the second transistor respectively, and
    a resistor Rs, which represents the electric resistance of the substrate 2.

The two diodes D100 and D200 are each connected between:
    on the one hand, a common point A, which represents the upper face of the substrate 2, and
    on the other hand, the rear face 17, 27 of the transistor 10, 20 under consideration.

For each of these diodes D100, D200, the forward direction of the diode is from point A (that is: from the substrate) to the rear face 17, 27 of the transistor.

The common point A is further connected to the source electrode S1 of the first transistor 10 via the resistor Rs (to account for the substrate's own resistor Rs and the metal connection 9 between the substrate 2 and the electrode S1).

Finally, the rear face 27 of the second transistor 20 is connected by an electric connector to the source electrode S2 of this transistor (to account for the presence of the metal conductor 28, in the device 1). Similarly, the rear face 17 of the first transistor 10 is connected by an electric connector to the source electrode S1 of the first transistor (to account for the presence of the metal conductor 18, in the device 1).

The characteristics of these diodes, in particular their junction capacitance, are chosen to be representative of the P-N junction actually made between the first 101, 201 and second layers 102, 202. Similarly, in this equivalent electric circuit, the characteristics of the transistors are chosen to be as close as possible to the characteristics expected in practice for the transistors 10 and 20 of the structure of FIG. 3.

The DC voltage source 31, which supplies the supply voltage Up of the device 1, is connected between an electric ground M on the one hand, and the drain electrode D2 of the second transistor 20 on the other hand. The negative output terminal of this voltage source is connected to the electric ground M. Its positive output terminal is connected to the electrode D2, via a resistor Rp (this resistor, for example of a hundred Ohms, simply avoids over-currents, in case of a short-circuit at the output of this power supply circuit, or upon simultaneous switching). In the digital simulations carried out on the basis of this equivalent circuit, the value of the electric voltage Up is, depending on the case, either 500 volts or 250 volts.

The square-wave voltage source 32 is connected between the source S1 and the gate G1 of the first transistor 10. Similarly, the square-wave voltage source 33 is connected between the source S2 and the gate G2 of the second transistor 20. In the digital simulations in question, each of these sources provides a square-wave voltage having a frequency of 25 kilohertz, a duty cycle of ½, and high and low voltage levels adapted to control the transistor 10, 20 under consideration in its off-state, or, respectively, in its on-state. The electric square-wave voltages supplied by the voltage source 32 and the voltage source 33, respectively, are in quadrature with each other, so that the two transistors 10 and 20 are driven in their on-state alternately, one relative to the other (one is on and the other is off, then vice versa, and so on).

Figure 5B:
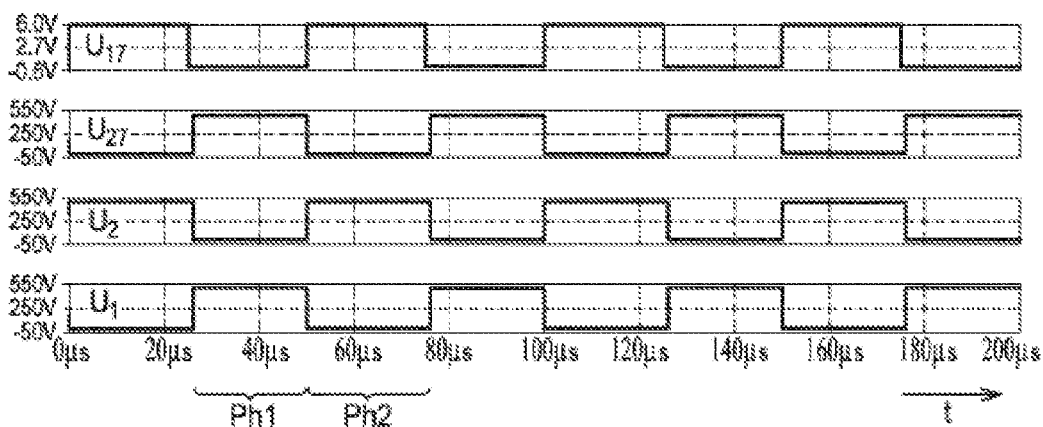
FIG. 5B shows the change over time of different electric voltages, in the circuit of FIG. 5A, when the first and second transistors of the bridge arm are switched alternately relative to each other to cut off a DC supply voltage.

FIG. 5B shows, in the form of an oscillogram, the change over time t of different electric voltages in the circuit of FIG. 5A. In this figure, time is expressed in microseconds and voltages are expressed in volts. For this simulation, the supply voltage Up is 500 volts and the resistor Rs of the substrate is 100 Ohms. The electric voltages represented are:

the voltage $U1=V_{D1}-V_{S1}$ (where $V_{D1}$ and $V_{S1}$ are the respective electric potentials of the drain D1 and the source S1 of the first transistor 10), the voltage $U2=VD_2-V_{S2}$, the voltage $U_{17}$, which is equal to the electric potential of the rear face 17 of the first transistor 10, relative to the reference electric potential of the electric ground M, and the voltage $U_{27}$, equal to the electric potential of the rear face 27 of the second transistor 20, relative to the electric potential of the electric ground M.

On this oscillogram, two successive periodically repeated phases Ph1 and Ph2 can be distinguished.

During the first phase Ph1, the first transistor 10 is off whereas the second transistor 20 is on. The voltage U2 is therefore equal or nearly equal to 0 volts whereas the voltage U1 is equal or nearly equal to 500 volts (see FIG. 5B). The electric potentials of the drain and source electrodes of the transistors 10 and 20 are then (relative to the potential of the electric ground M): $V_{S1}$~0 volts and $V_{D1}=V_{S2}=V_{D2}$~500 volts (the symbol ~ means "approximately equal to").

As for the potentials $U_{17}$ and $U_{27}$, this simulation shows that during this first phase they are 0 volts and 500 volts respectively (see FIG. 5B).

For each of the two transistors 10 and 20, the potential $U_{17}$, $U_{27}$ of the rear face of the transistor is therefore close, and even equal, to the electric potential $V_{S1}$, or $V_{S2}$, of the source electrode S1, S2 of this transistor (by virtue of which, as already explained, the "current-collapse" trapping problems are limited).

During the second phase Ph2, the first transistor 10 is on whereas the second transistor 20 is off. The voltage U2 is therefore equal or nearly equal to 500 volts whereas the voltage U1 is equal or nearly equal to 0 volts (see FIG. 5B). The electric potentials of the drain and source electrodes of the transistors 10 and 20 are then: $V_{S1}=V_{D1}=V_{S2}$~0 volts and $V_{D2}$~500 volts.

As for the potentials $U_{17}$ and $U_{27}$, during this second phase, they are both equal or nearly equal to 0 volts (see FIG. 5B). Also, during this second phase, and for each of the two transistors 10 and 20, the potential $U_{17}$, $U_{27}$ of the rear face of the transistor is thus close, and even equal, to the electric potential $V_{S1}$, or $V_{S2}$ of the source electrode S1, S2 of the transistor under consideration.

These results, obtained for the two switching phases of transistors Ph1 and Ph2, do show that the device of FIG. 3 allows the control of the electric potentials of the rear faces of the transistors of a switching bridge arm, in a way that limits the trapping and current-collapse effects.

Figure 6:
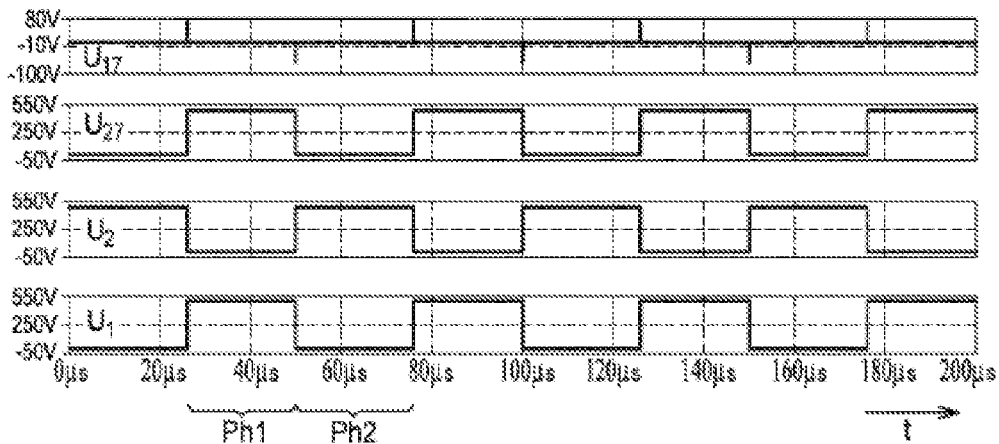
FIG. 6 shows the change over time of different electric voltages, in an alternative of the circuit of FIG. 5A based on a different bridge arm version.

FIG. 6 shows an oscillogram comparable to that of FIG. 5B, but with the following modification to the circuit of FIG. 5A: the rear face 17 of the first transistor is no longer connected directly, via a metal conductor, to its source electrode. In other words, FIG. 6 corresponds to the case of a device, such as that of FIG. 3, but in which the metal connector 18 would have been omitted.

It is noticed that, in this configuration too, for each of the two transistors 10 and 20, the potential $U_{17}$, $U_{27}$ of the rear face of the transistor remains close, and even equal, to the electric potential $V_{S1}$, or $V_{S2}$ of the source electrode S1, S2 of the transistor under consideration, both during the first switching phase, Ph1, and during the second phase Ph2.

However, on the oscillogram of FIG. 6, at the switching of the transistors, that is, when passing from phase 1 to phase 2 (or when passing from phase 2 to phase 1), it is observed, for the electric potential $U_{17}$, a stray voltage spike, which, in a transient manner, reaches a value of approximately 80 volts. It is of course desirable to limit the amplitude of this stray voltage spike as much as possible, in order to maintain the electric potential $U_{17}$ at 0 volts at all times. This can be obtained by connecting, via a metal conductor, the rear face 17 to the source electrode S1 of the first transistor (as in the case of FIG. 5B) and/or by limiting the resistance of the substrate 2. Indeed, it turns out that the amplitude of the stray voltage spike in question depends directly on the value of the resistor Rs, which represents the resistance of the substrate 2. This amplitude is all the smaller as the resistor Rs is small, and, for a resistor Rs of 10 Ohms instead of 100 Ohms, this spike reaches a value of only 8 volts. A stray voltage spike of this amplitude is considered negligible for this application (especially in view of the supply voltage Up, here 500 volts), which explains the choice, indicated earlier in the description of the device 1 itself, to reduce the resistance of the substrate below 10 Ohms (by virtue of a sufficiently high doping).

Figure 7:
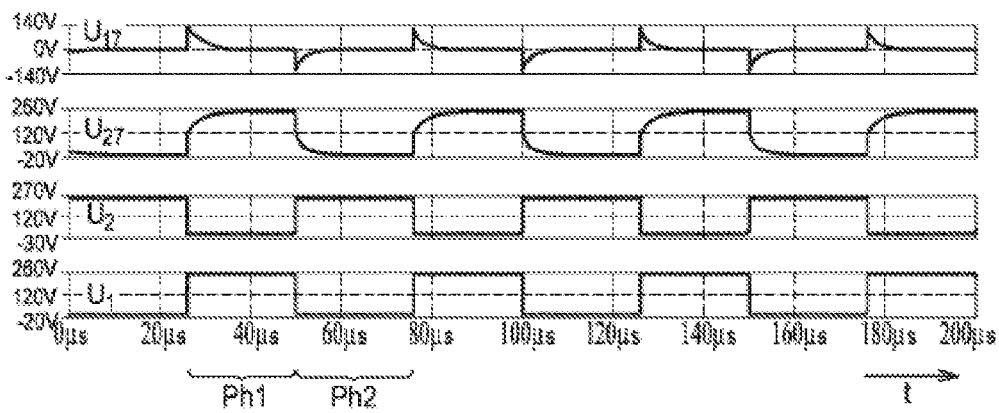
FIG. 7 shows the change over time of different electric voltages, in another alternative of the circuit of FIG. 5A, based on a different bridge arm version.

FIG. 7 shows an oscillogram comparable to that of FIG. 5B, but obtained for a supply voltage Up of 250 volts, and having made the following modifications to the circuit of FIG. 5A:

the rear faces 17 and 27 of the two transistors 10 and 20 are no longer connected to their source electrodes S1 and S2, and the substrate 2 remains floating, that is, it is no longer connected to the source electrode S1 of the first transistor 10 (this amounts to removing the connection made by the resistor Rs, in the equivalent circuit).

In other words, FIG. 7 corresponds to the case of a device, such as that of FIG. 3, but in which the metal connectors 18, 28 and 9 would have been omitted.

As previously, during the first phase Ph1, the values of the electric potentials of the drain and source electrodes of the transistors 10 and 20 are as follows: $V_{S1}$~0 volts and $V_{D1}=V_{S2}=V_{D2}$ Up=250 volts. And as can be seen in FIG. 7, except for a short transient period, the potentials on the rear faces of the transistors are then as follows: $U_{17}$~0 volts and $U_{27}$~250 volts, that is, $U_{17}$~$V_{S1}$ and $U_{27}$~$V_{S2}$, which is what is sought to avoid trapping phenomena.

And during the second phase Ph2: $V_{S1}=V_{D1}=V_{S2}$~0 volts and $V_{D2}$ Up=250 volts, whereas (c.f. FIG. 7) $U_{17}$~0 volts and $U_{27}$~0 volts (except during a short transient period). Thus, during this second phase, there is also: $U_{17}$~$V_{S1}$ and $U_{27}$~$V_{S2}$ (which is what is sought to be obtained).

This illustrates that the electric voltage maintenance stacks 100 and 200 (represented by diodes D100 and D200) make it possible to effectively maintain the potentials of the rear faces of transistors 10, 20 at values close to the potentials of the source electrodes S1 and S2, even in the absence of metal conductors 18, 28, and even in the absence of the metal conductor 9 that connects the substrate 2 to the source electrode S1 of the first transistor 10.

However, it is noticed that the stray voltage spike, which occurs upon switching of the transistors, has a greater amplitude and duration than in the case where the metal connectors 28 and 9 are present, which clearly shows the interest of these connectors. With regard to this stray voltage spike, it should be noted that its duration is directly related to the junction capacitance of the voltage maintenance stacks 100 and 200 (the simulations in question confirm that the duration of this spike is greater the higher this junction capacitance is).

Figure 8:
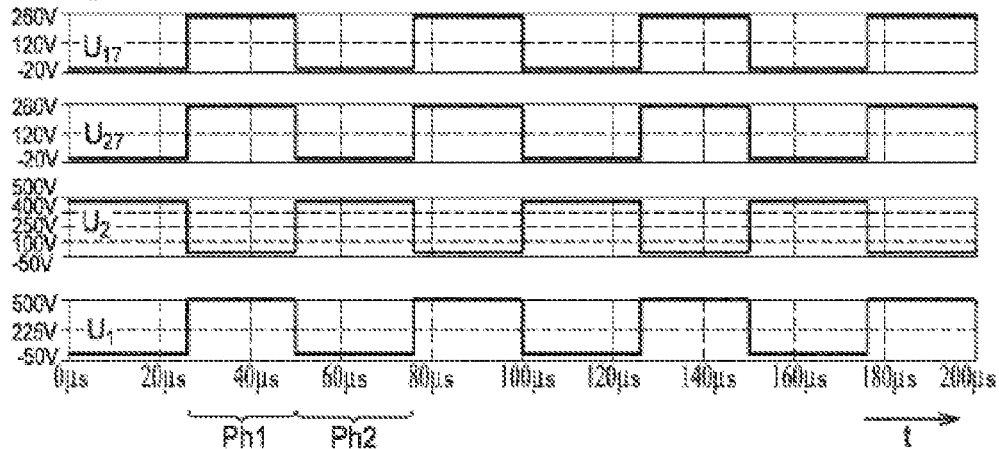
FIG. 8 shows the change over time of different electric voltages in an alternative of the circuit of FIG. 5A based on a conventional bridge arm with a non-insulated substrate.

FIG. 8 shows an oscillogram comparable to FIG. 5B, but with the following modifications to the circuit in FIG. 5A:
- the diodes D100 and D200 have been removed,
- the rear faces 17 and 27 of the two transistors 10 and 20 are no longer connected to their source electrodes S1 and S2 (indeed, as the diodes D100 and D200 have been removed, maintaining these connections would amount to short-circuiting the sources S1 and S2, via the common substrate 2), and
- the substrate 2 remains floating, that is, it is no longer connected to the source electrode S1 of the first transistor 10.

The simulation in FIG. 8 thus corresponds to the case of a conventional switching bridge arm, in which the voltage maintenance stacks 100 and 200 (represented by the diodes D100 and D200) would be omitted.

In this case, during the second phase Ph2 ("low side" transistor 10 on and "high side" transistor 20 off), the values of the electric potentials of the drain and source electrodes are as follows: $V_{S1}=V_{D1}=V_{S2}$=about 0 volts and $V_{D2}$=Up=about 500 volts, whereas (see FIG. 8) $U_{17}$=about 0 volts and $U_{27}$=about 0 volts, that is, $U_{17}$ about equal to $V_{S1}$ and $U_{27}$ about equal to $V_{S2}$, which is what is sought.

But, however, during the first phase Ph1 ("low side" transistor 10 off, and "high side" transistor 20 on), these potentials are: $V_{S1}$~0 volts and $V_{D1}=V_{S2}=V_{D2}$~Up=500 volts. And as can be seen in FIG. 8, the potentials of the rear faces of the transistors are then as follows: $U_{17}$~260 volts and $U_{27}$~260 volts. These potentials $U_{17}$ and $U_{27}$ are therefore clearly different from the potentials of the source electrodes S1 ($V_{S1}$~0 volts) and S2 ($V_{S2}$~500 volts), which is unfavourable in terms of trapping/"current-collapse", especially as the first transistor 10 is then in its off-state. It is precisely this type of electric configuration, unfavourable in terms of trapping, that is avoided by the voltage maintenance stacks 100 and 200.

In the embodiments described above, the microelectronic device, with P-N junction insulated substrate, is provided with two HEMT type heterojunction transistors.

But in other embodiments, the microelectronic device, with a P-N junction insulated silicon substrate, could be equipped with GaN-based transistors of another type than HEMT transistors, for example LD-MOS (laterally-diffused metal-oxide semiconductor) type transistors, the P-N junctions in question then making it possible to prevent possible trapping/"current collapse" problems in these components.

Moreover, the whole microelectronic device structure set forth above, with P-N junction insulated substrate, can be applied to make more complete devices than the bridge arm of FIG. 3.

Figure 14:
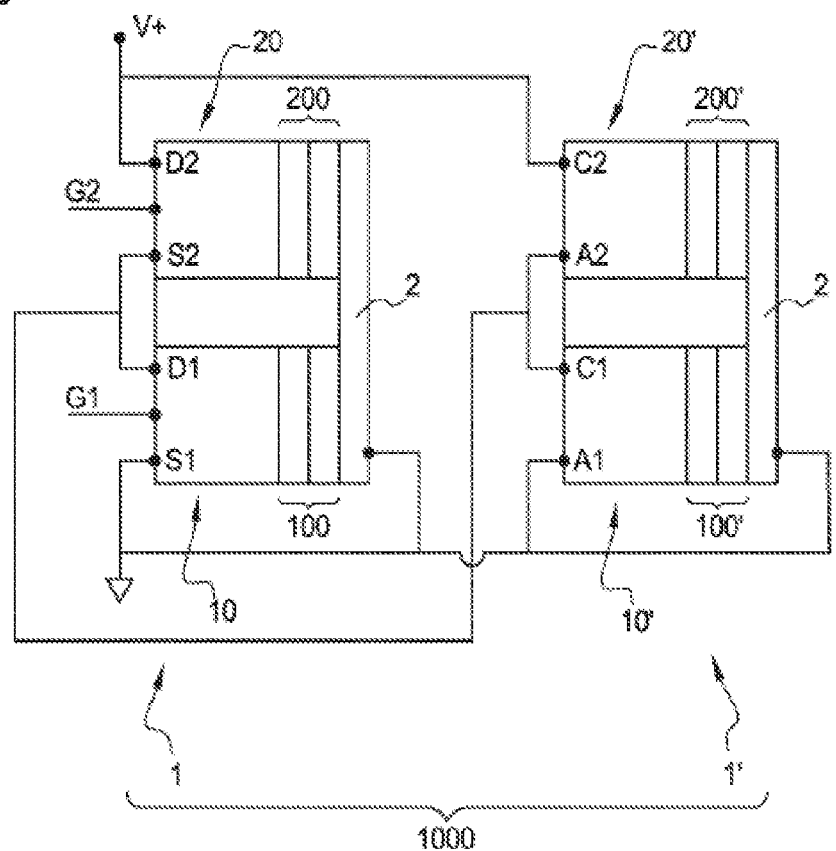
FIG. 14 schematically represents a complete switching bridge arm, in particular comprising the bridge arm of FIG. 3.
Figure 15:
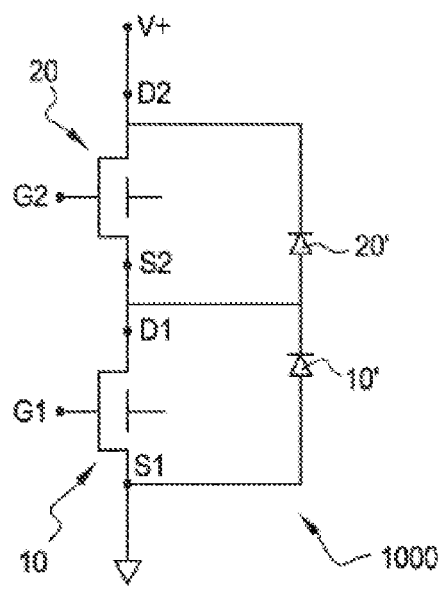
FIG. 15 is a diagram of an equivalent electric circuit, partially representing the complete switching bridge arm of FIG. 14.

For example, a complete switching bridge arm, 1000, such as that represented in FIGS. 14 and 15, can be made. This complete bridge arm 1000 comprises:
- a first device 1, such as that in FIG. 3, and
- a second device 1', identical or at least similar to the first device 1, but in which the first and second components 10' and 20' are diodes, instead of transistors.

The second device 1' also comprises, for each component 10', 20', a voltage maintenance stack 100', 200' such as those, 100 and 200, described above.

In this device, the cathode C1 of the first diode 10' is connected by a metal conductor to the anode A2 of the second diode 20'. The cathode C2 of the second diode 20' is connected by a metal conductor to the drain D2 of the second transistor 20. The anode A1 of the first diode 10' is connected by a metal conductor to the source S1 of the first transistor 10. The cathode C1 of the first diode 10' is also connected, by a metal conductor, to the drain D1 of the first transistor 10. The two diodes 10' and 20' are thus connected respectively to the two transistors 10 and 20 of the bridge arm 1, in parallel with them, and so as to be able to serve as freewheeling diodes for these transistors (see FIG. 15, which partially represents the complete bridge arm 1000, in the form of an equivalent electric circuit).

The diodes 10' and 20' are GaN-based heterojunction diodes. The entire bridge arm 1000 is made on the same substrate 2 and its voltage maintenance stacks 100, 200, 100' and 200' are cut from a same pair of layers that form an extended planar P-N junction, initially in one piece (before cutting). The integration on this substrate 2 of the various components of the complete bridge arm 1000, each insulated from the substrate 2 by a P-N junction, is therefore particularly convenient and can be made by essentially planar technologies.

The overall structure of the microelectronic device set forth above, with a P-N junction insulated substrate, can also be advantageously applied to make, on the same substrate, a monolithic multiphase inverter, for example a three-phase inverter. In this case, three or six complete switching bridge arms such as the bridge arm 1000 set forth above are made on this substrate, these three or six bridge arms being connected in parallel with each other. Here again, the voltage maintenance stacks associated with the various components can advantageously be cut from the same pair of silicon layers, respectively p- and n-doped, initially in one piece.

An example of a method for manufacturing the device 1 of FIG. 3 is described now, with reference to FIGS. 9 to 13.

Figure 9:
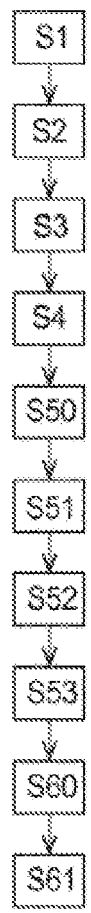
FIG. 9 schematically represents a sequence of steps in a manufacturing method for making the bridge arm of FIG. 3.

As can be seen in FIG. 9, this method comprises the following steps
- S1: making a layer 501, which extends over the substrate 2, and which is formed here of p-type doped silicon; the various parts of this layer 501, which will be obtained by cutting the layer, will form respectively the first layer 101, and the first layer 201 of the two voltage maintenance stacks of the device, and then
- S2: making an additional layer 502, which extends over the layer 501, and which is formed here of n-type doped silicon; the various parts of this additional layer 502, which will be obtained by cutting this layer, will respectively form the second layer 102, and the first layer 202 of the two voltage maintenance stacks of the device, and then
- S3: making the first and second components 10 and 20 described above, which each extend over the additional layer 502 (step S3 does not, however, comprise making the metal connections 18, 28, 6, 9, or the bonding or isolation trenches 3 and 7).

Figure 10:
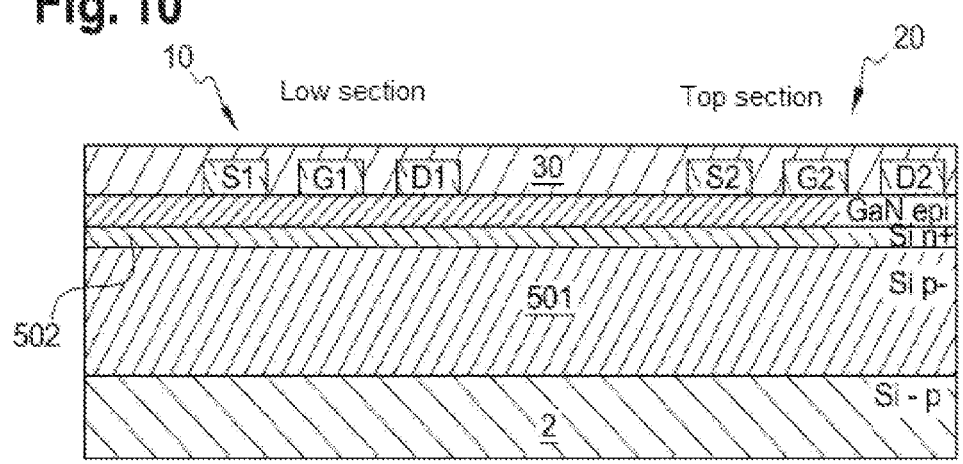
FIG. 10 schematically represents the bridge arm of FIG. 3, at an intermediate stage of its manufacture, before making metal connections passing through this device, and before making an isolation trench laterally separating the first transistor from the second transistor, in a cross-section and side view.

FIG. 10 schematically represents the device 1 being manufactured, just after step S3, in a cross-section and side view.

The method then comprises the following step:
- S4: for each component 10, 20, making a metal connection electrically connecting the additional layer 502 to the first electrode S1, S2 of this component 10, 20.

Each of these connections is obtained here:
- by making a trench with electrically insulated flanks, which extends vertically to the additional layer 502, and then by making a metal conductor 18, 28 which extends from the electrode S1, S2 in question to this layer 502, through the trench in question.

FIG. 11 schematically represents the device 1 being manufactured, just after step S4, in a cross-section and side view.

The method then comprises the following steps:

S50: opening the isolation trench 3, which laterally separates the first component 10 from the second component 20, this trench extending vertically through the layer 501 and the additional layer 502 to the substrate 2, this trench also separating the first voltage maintenance stack 100 from the second voltage maintenance stack 200, which are thus delimited in the pair of layers 501, 502 by the trench 3 in question (and possibly by other trenches made around the components 10 and 20), S51: opening the bonding trench 7, which extends vertically from an upper face of the first component 10 to the substrate 2, by passing through the layer 501 and the additional layer 502, S52: filling the insulation trench(es) 4 with an electrically insulating material, in this case silica $SiO_2$, and S53: depositing an insulating material 8 covering the side walls of the bonding trench 7 (in order to create a trench with insulated flanks), in this case by completely filling this trench with silica.

Steps S50 and S51 can be performed in a same operation of deep etching the device 1. This etching can for example be a deep reactive ion etching (RIE).

Steps S52 and S53 of filling the trenches can also be performed in a same operation.

FIG. 12 schematically represents the device 1 being manufactured, just after step S53, in a cross-section and side view.

Here, as the bonding trench 7 has been completely filled with silica in step S53, the method then comprises a step S60 of opening a passage, which passes through the insulating material 8 from one side to the other. This passage thus passes through the entire bonding trench 7, and opens into the substrate 2, or at the interface between the substrate and the layer 101.

The method then comprises a step S61 of making a metal connection 9, which extends through the bonding trench 7 and electrically connects the substrate 2 to the first electrode S1 of the first component 10. In this step, a metal can be deposited in the above-mentioned passage, for example by electrochemical deposition (ECD).

FIG. 13 schematically represents the device 1 after these manufacturing steps.

The invention claimed is:

1. A microelectronic device comprising a first electronic component, at least a second electronic component, and a substrate serving as a support for said first and second electronic components,
the substrate being formed of a first semiconductor material,
the first electronic component and the second electronic component each comprising an active layer formed at least in part of a second semiconductor material different from the first semiconductor material,
the microelectronic device further comprising, for each of said first and second electronic components, an electric voltage maintenance stack:
which is located between the substrate and the active layer of the electronic component under consideration,
which comprises a first layer and a second layer which extend over each other, the first layer being located under the second layer, between the second layer and the substrate, the first layer being made from said first semiconductor material, with a doping, p or n, of the same type as for the substrate whereas the second layer is made from said first semiconductor material, with a doping, n or p, of the type opposite to the doping of the substrate,
wherein:
an assembly comprising the first electronic component and its electric voltage maintenance stack, and
an assembly comprising the second electronic component and its electric voltage maintenance stack
are separated from each other laterally by a barrier of electrically insulating material, and wherein for each electric voltage maintenance stack, a volume concentration of dopant element in the second layer varies gradually as a function of a distance separating the first layer from a point under consideration in the second layer, said concentration increasing with said distance, with a rate of variation of between $10^2$ and $10^5$ per micron.

2. The device according to claim 1, wherein for each electric voltage maintenance stack, the volume concentration of dopant elements in the first layer is lower than a volume concentration of dopant elements in the substrate.

3. The device according to claim 1, wherein the active layer of each of said first and second electronic components comprises a heterojunction, said heterojunction including
a third layer formed at least in part of said second semiconductor material, and
on the third layer, a fourth layer formed at least in part of a third semiconductor material, the second and third semiconductor materials having different energy gaps.

4. The device according to claim 2, wherein for each electric voltage maintenance stack, the volume concentration of dopant elements in the first layer is lower than one hundredth of the volume concentration of dopant elements in the substrate.

5. The device according to claim 1, wherein the first semiconductor material is based on silicon and wherein the second semiconductor material is based on Gallium nitride.

6. The device according to claim 1, further comprising, for each of said first and second electronic components, a stack of transition layers and/or a buffer layer, interposed between the electric voltage maintenance stack on the one hand, and the active layer of the electronic component under consideration on the other hand.

7. The device according to claim 1, wherein the concentration of dopant species in the substrate is such that the electrical conductivity of the substrate, at room temperature, is greater than 1 siemens per centimetre.

8. The device according to claim 1, wherein:
each of the first and second electronic components comprises a first electrode and a second electrode connected to each other by the active layer of the electronic component, and wherein
the second electrode of the first electronic component is connected to the first electrode of the second electronic component by a metal conductor.

9. The device according to claim 8, wherein the first electrode of each of said first and second electronic components is connected by a metal conductor to the second layer of the voltage maintenance stack associated with said electronic component.

10. The device according to claim 8, wherein the first electrode of the first electronic component is connected to the substrate by a metal conductor.

11. The device according to claim 8, wherein each of said first and second electronic components is a transistor, the first electrode of the electronic component being a source electrode whereas its second electrode is a drain electrode.

12. The device according to claim 8, wherein each of said first and second electronic components is a diode, the first electrode of the electronic component being an anode electrode whereas its second electrode is a cathode electrode.

13. A method for manufacturing a microelectronic device made on a substrate formed of a first semiconductor material, the method comprising:
   making a layer, which extends over the substrate and which is formed of said first semiconductor material, with a doping, p or n, of a same type as for the substrate, and then
   making an additional layer, which extends over said layer and which is formed of said first semiconductor material, with a doping, n or p, of a type opposite to the doping of the substrate, and then
   making a first electronic component and at least a second electronic component, which each extend over said additional layer, the first electronic component and the second electronic component each comprising an active layer formed at least in part of a second semiconductor material different from the first semiconductor material,
   making an isolation trench, which laterally separates the first electronic component from the electronic second component, said trench extending vertically through said layer and said additional layer to delimit:
   a first electric voltage maintenance stack located between the first electronic component and the substrate, and
   a second electric voltage maintenance stack, located between the second electronic component and the substrate,
   each of said stacks comprising a first layer and a second layer which extend over each other, the first layer and the second layer being delimited by said trench, in said layer and in said additional layer respectively, wherein for each electric voltage maintenance stack, a volume concentration of dopant element in the second layer varies gradually as a function of the distance separating the first layer from the point under consideration in the second layer, said concentration increasing with said distance, with a rate of variation of between $10^2$ and $10^5$ per micron, and
   filling said trench with an electrically insulating material.

14. The method according to claim 13, wherein the of making the first electronic component and the second electronic component comprises, for each electronic component, making a first electrode and a second electrode connected to each other by the active layer of the electronic component under consideration, the method further comprising:
   for each electronic component, making a metal connection electrically connecting the first electrode of the electronic component under consideration to the second layer of the voltage maintenance stack associated with said electronic component.

15. The method according to claim 14, further comprising:
   making a bonding trench, which extends vertically from the first electronic component to the substrate by passing through said layer and said additional layer,
   depositing an insulating material covering the side walls of said bonding trench, or filling the bonding trench with an insulating material, and then
   making a metal connection which extends through the bonding trench and which electrically connects the substrate to the first electrode of the first electronic component.

* * * * *